(12) United States Patent
Ross

(10) Patent No.: US 10,135,443 B1
(45) Date of Patent: Nov. 20, 2018

(54) EXTENDED VOLTAGE RANGE COLDSPARE TOLERANT OFF CHIP DRIVER

(71) Applicant: BAE SYSTEMS INFORMATION AND ELECTRONIC SYSTEMS INTEGRATION INC., Nashua, NH (US)

(72) Inventor: Jason F. Ross, Haymarket, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/668,094

(22) Filed: Aug. 3, 2017

(51) Int. Cl.
| | |
|---|---|
| *H03K 19/003* | (2006.01) |
| *H03K 17/0814* | (2006.01) |
| *H03K 19/177* | (2006.01) |
| *H03K 19/00* | (2006.01) |
| *H03K 19/0185* | (2006.01) |

(52) U.S. Cl.
CPC . *H03K 19/00315* (2013.01); *H03K 17/08142* (2013.01); *H03K 19/0016* (2013.01); *H03K 19/01855* (2013.01); *H03K 19/17744* (2013.01); *H03K 19/17788* (2013.01)

(58) Field of Classification Search
CPC ....... H03K 19/00315; H03K 19/17788; H03K 17/08142
USPC ........................................................ 362/207
See application file for complete search history.

(56) References Cited

U.S. PATENT DOCUMENTS

| | | | |
|---|---|---|---|
| 5,004,936 | A | 4/1991 | Andresen |
| 5,117,129 | A | 5/1992 | Hoffman et al. |
| 5,144,165 | A | 9/1992 | Dhong et al. |
| 5,151,619 | A | 9/1992 | Austin et al. |
| 5,406,140 | A | 4/1995 | Wert et al. |
| 5,570,043 | A | 10/1996 | Churchill |
| 5,635,861 | A | 6/1997 | Chan et al. |
| 5,729,157 | A | 3/1998 | Monk et al. |
| 5,731,714 | A | 3/1998 | Monk et al. |
| 5,867,039 | A | 2/1999 | Golke |
| 6,414,360 | B1 | 7/2002 | Gardner |
| 6,456,124 | B1 | 9/2002 | Lee et al. |
| 7,239,177 | B2 | 7/2007 | Bansal |
| 2013/0207689 | A1* | 8/2013 | Bansal ............. H03K 19/01858 326/82 |

OTHER PUBLICATIONS

Nelson, Victor P., Fault-Tolerant Computing: Fundamental Concepts, Computer, vol. 23, No. 7, Jul. 1990, pp. 19-25.

* cited by examiner

*Primary Examiner* — Toan Ly
(74) *Attorney, Agent, or Firm* — Sand & Sebolt, LPA

(57) ABSTRACT

An off chip driver circuit includes a bias circuit and a driver sub-cell circuit. The bias circuit and off chip driver sub-cell circuit are in electrical communication with each other. The bias circuit includes two serially aligned diodes which are in an off-state when the driver sub-cell is in a functional mode and which are in an on-state when the driver sub-cell is in a cold spare mode. The arrangement of the diodes enables the off chip driver circuit to handle similar voltage signals in both the functional mode and the cold spare mode.

20 Claims, 10 Drawing Sheets

EXTENDED VOLTAGE RANGE COLDSPARE TOLERANT OFF CHIP DRIVER

BACKGROUND

Technical Field

The present disclosure relates to circuits having cold spare capabilities. More particularly, the present disclosure relates to an off chip driver with an extended voltage range in a cold spare mode.

Background Information

An off chip driver circuit typically drives logic levels relating to supply voltages of the circuit off the chip while protecting against any high voltages which may occur when the off chip driver circuit is disabled and its output terminal is coupled to an external circuit operating at a higher supply voltage. It is desirable to provide this protection while minimizing the number of transistors and therefore the chip area utilized by the off chip driver circuit. Off chip drivers include electronic circuitry which is configured to send at least one signal from one chip to another chip, as the at least one signal is being driven off the chip, hence the name "off chip driver." Off chip driver circuits are commonly used to allow such integrated circuits operating at different power supply voltage levels to communicate with each other.

In some implementations, it is advantageous for the off chip driver to have both a functional mode and a cold spare mode. Cold spare modes are typically utilized to reduce or eliminate forward bias of signals moving through the circuit so as to preserve the integrity thereof. Cold spare capability generally refers to the circuit's ability to withstand or not sustain any damage when the circuit is being actively signaled without any power. This is important because for at least two reasons. The first is that in a system having multiple cards in a computer, the cards do not necessarily draw power at the same time. So it is possible for signals to be active into a card before the power supply comes on because different cards power up sooner. The second reason, is that many times there may be redundant computer cards that are physically powered off until they are needed when the first one fails. In this second case, there may be signals going into that card in the unpowered state which need to be protected so as to not damage the circuit in its unpowered state.

Others have constructed off chip drivers with cold spare capabilities. For example, U.S. Pat. No. 5,117,129 (the '129 patent) provides a circuit with fault tolerant, cold sparing logic. The '129 patent implements P-Channel FET transistors formed in an end well which has a high biasing transistor to decouple the circuit when the circuit is not powered. One inherent feature of the circuit provided in the '129 patent is that voltage moving through the circuit in its functional mode is higher than the voltage moving through the circuit in the cold spare mode. Stated otherwise, the cold spare capability voltage is less than the operational voltage of the circuit.

Another off chip driver with cold spare capability is provided in U.S. Pat. No. 5,867,039 (the '039 patent), which provides an output driver circuit P-Channel substrate that has a redundancy circuit when its power supply is connected to ground in order to keep the circuit in an unbiased storage until it is needed. The '039 patent indicates that high reliability applications, such as spacecraft applications, require cold spare conditioning of components. The cold spare provides a spare or redundant power supply that is connected to ground and kept in an unbiased storage until the part is needed. The '039 patent indicates that the cold spare circuit output remains connected to an active signal or data buss while in a cold spare mode and must therefore present a high impedance to the active signal. While the '039 patent may be effective in some implementations, the voltage in the connection to the active signal in cold spare mode is less that the voltage moving through the circuit when it is in its functional transparent mode.

SUMMARY

Issues continue to exist with off chip drivers and their cold spare capabilities. One of the issues is a need continues for an off chip driver with cold spare capability that is able to handle a similar voltage in both the functional mode and a cold spare mode. This is believed to be an improvement over the features of the conventional off chip drivers with cold spare capabilities which are only capable of handling a lesser voltage in the cold spare mode. The present disclosure addresses these and other issues.

In one aspect, an exemplary embodiment the present disclosure may provide an off chip driver circuit comprising: a functional mode at a first voltage; and a cold spare mode at the first voltage; wherein the circuit supports the first voltage in both the functional mode and the cold spare mode. This embodiment or another embodiment may further include a bias circuit; and an off chip driver sub-cell circuit, wherein the bias circuit is operatively coupled to the off chip driver sub-cell circuit and the bias circuit generates signals for cold spare voltage protection in the off chip driver. This embodiment or another embodiment may further include a chip pad input/output (I/O) having a signal to be protected pass therethrough; a first diode in electrical communication with the chip pad I/O; a second diode in series with the first diode; wherein the first and second diodes define a feedback voltage in an electro static discharge (ESD) device with the chip pad i/o to cause the circuit to be transparent in functional mode and operational in cold spare mode. This embodiment or another embodiment may further include a first output (vir_vdd_io); a second output (vir_vbias); wherein the first output (vir_vdd_io) and second output (vir_vbias) are operatively connected to the off chip driver sub-cell circuit; wherein when the bias circuit is in the functional mode, the first output (vir_vdd_io) equals a driver circuit power supply voltage (vdd_io) such that the first and second diodes are electrically transparent such that signals flow directly and uninterrupted from the driver circuit power supply voltage (vdd_io) to first output (vir_vdd_io). This embodiment or another embodiment may further include a first p-channel field effect transistor (pFET) electrically coupled between the first output (vir_vdd_io) and the driver circuit power supply voltage (vdd_io) configured to be turned off in cold spare mode to pass voltage directly from the driver circuit power supply voltage (vdd_io) to the first output (vir_vdd_io). This embodiment or another embodiment may further include wherein the first and second diodes siphons input voltage from the chip pad i/o in the cold spare mode. This embodiment or another embodiment may further include wherein subtracting the second voltage from the first voltage is adapted to enable transistors to be stacked to support the similar voltage in the cold spare mode. This embodiment or another embodiment may further include a bias voltage generated from the driver circuit power supply voltage (vdd_io) in functional mode and generated from the two series diodes in the ESD in cold spare mode, wherein the bias voltage is adapted to maintain other transistors below an operating voltage maximum for each of the other transistors while the total circuit operates at higher than the voltage maximum for each respective transistor. This embodiment or another embodiment may further include an off-state and an on-state of the first and second diodes; a threshold voltage of the first and second diodes, wherein when voltage from the chip pad I/O exceeds the threshold voltage, the first and second diodes are switched from the off-state to the on-state, and switching the first and second diodes from the off-state to the on-state switches the circuit from the functional mode to the cold spare mode. This embodiment or another embodiment may further include wherein when the bias circuit is in cold spare mode, the voltage at the first output (vir_vdd_io) is two diode drops less than the voltage at the first output (vir_vdd_io) in functional mode, and the voltage at the second output (vir_vbias) is two diode drops less than the voltage at the second output (vir_vbias) in functional mode. This embodiment or another embodiment may further include wherein the bias circuit does not affect functionality of the off chip driver sub-cell circuit in functional mode. This embodiment or another embodiment may further include at least one resistor located intermediate the first input (vdd_io) and the first output (vir-vdd_io) to bleed voltage prior to the first output in the cold spare mode adapted to assist phantom powering of the first output (vir_vdd_io) in cold spare mode to prevent a build up of voltage over time. This embodiment or another embodiment may further include a functional mode first voltage and the first input (vdd_io); a functional mode second voltage at a second input (vbias); wherein the functional mode first and second voltages at the respective first and second inputs are different. This embodiment or another embodiment may further include a first inverter having a first inverter input; a second inverter having a second inverter input; wherein the first and second inverters include stacked transistors adapted to operate at an extended voltage range. This embodiment or another embodiment may further include wherein the first and second inverter inputs receive one signal therethrough at different voltage levels, and the signal is sent through the first and second inverters to the chip pad I/O. This embodiment or another embodiment may further include wherein if the circuit is powered off and in the cold spare mode, any voltage applied to the chip pad io is sent through the first and second diodes and out through the first output (vir_vdd_io) and the second output (vir_vbias) and into respective vir_vdd_io and vir_vbias inputs in the off chip driver circuit.

In another aspect, an embodiment of the present disclosure may provide a method comprising: providing an off chip driver circuit that switches between a functional mode and a cold spare mode, wherein the off chip driver circuit supports similar voltage in both the functional mode and the cold spare mode; passing supply and voltage protection signals through a bias circuit in the off chip drive circuit in the functional mode but passing voltages derived from a chip pad in the cold spare mode; and receiving the voltage signals, in an off chip driver sub-circuit, from the off bias circuit. This embodiment may further provide inputting a first voltage at a first input (vdd_io) and sending the first voltage towards a first output (vir_vdd_io); subtracting a second voltage passing through at least two diodes from the first voltage from the first voltage to establish a third voltage; and outputting the third voltage through the first output; wherein subtracting the second voltage from the first voltage is adapted to enable transistors to be stacked to support the similar voltage in the cold spare mode. This embodiment or another embodiment may further include creating bias voltages by sending voltage through two series diodes; applying the bias voltages to other transistors in the circuit, which is adapted to maintain the other transistors below an operating voltage maximum for each of the other transistors. This embodiment or another embodiment may further include in functional mode, generating the bias voltages directly from the first input (vdd_io); and in cold spare mode, generating the bias voltages through two series diodes coupled with a chip pad input/output (I/O). This embodiment or another embodiment may further include switching the two series diodes from and off-state to an on-state when voltage across the two series diodes exceeds a threshold voltage; and wherein switching the two series diodes from the off-state to the on-state switches the circuit from the functional mode to the cold spare mode. This embodiment or another embodiment may further include bleeding voltage into the first output (vir_vdd_io) across the two series diodes from a chip pad input/output (I/O) in cold spare mode; precluding voltage from bleeding voltage into the first output (I/O) so as to be functionally transparent in the functional mode. This embodiment or another embodiment may further include passing voltage from the first input to the first output without any effect from the two series diodes in functional mode; and passing voltage from a second input (vbias) to a second output (vir_vbias) without any effect from the two series diodes in functional mode.

In another aspect, the present disclosure may provide an off chip driver circuit that includes a bias circuit and a driver sub-cell circuit. The bias circuit and off chip driver sub-cell circuit are in electrical communication with each other. The bias circuit includes two serially aligned diodes which are in an off-state when the driver sub-cell is in a functional mode and which are in an on-state when the driver sub-cell is in a cold spare mode. The arrangement of the diodes enables the off chip driver circuit to handle similar voltage signals in both the functional mode and the cold spare mode.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
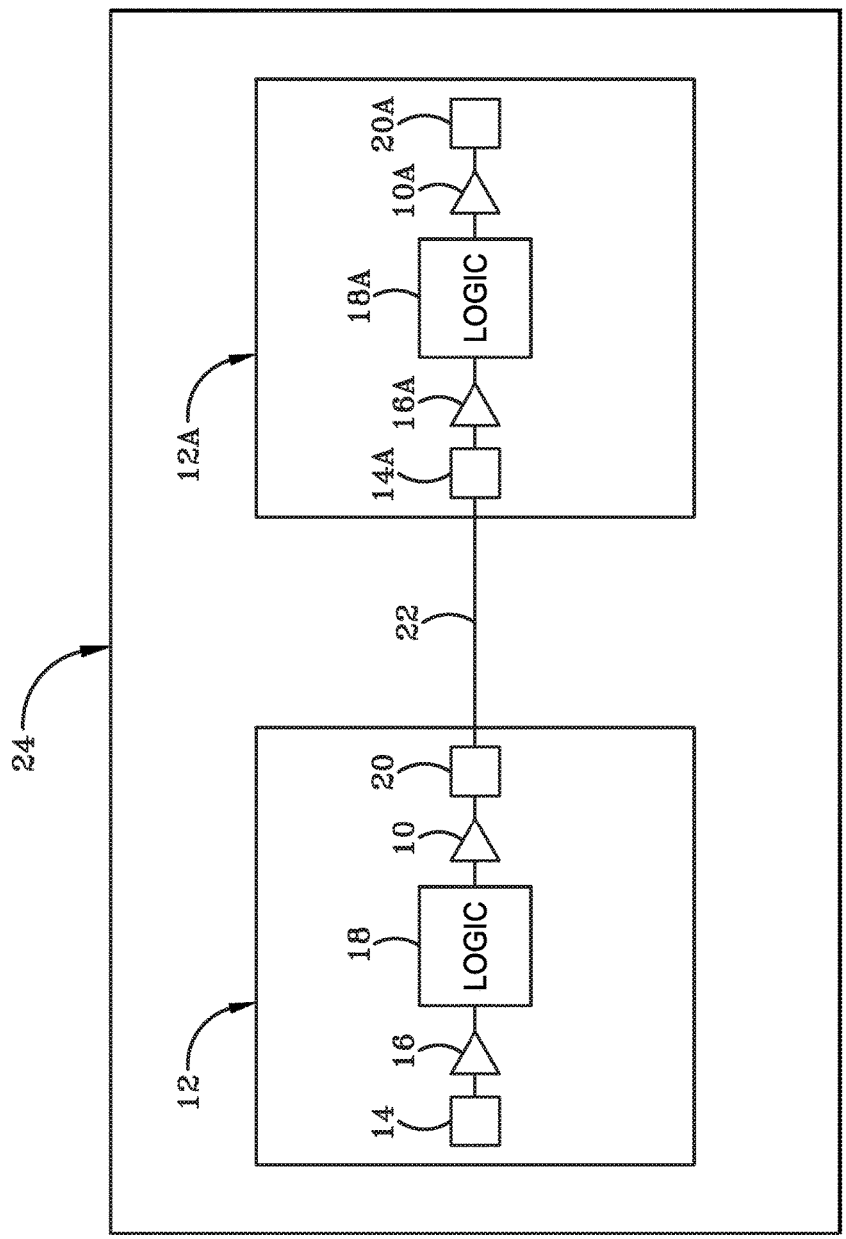
FIG. 1 (FIG. 1) is a diagrammatic view of a computer card with at least two chips thereon and at least one of the chips includes an off chip driver in accordance with one embodiment the present disclosure.

An off chip driver in accordance with one aspect of the present disclosure is shown generally throughout the figures at 10. The off chip driver 10 is part of an integrated circuit chip 12, which may also be referred to as a first chip 12 including an input/output (I/O) pad 14 connected with an on chip receiver 16 connected with logic 18 which is connected with the off chip driver 10 which is connected with the input/output pad 20. First chip 12 may be connected with a second chip 12A having similar components as the first chip 12. Similar components of second chip 12A are designated with the letter "A" after the respective reference numeral. I/O pad 14A on second chip 12A is an electrical communication with I/O pad 20 of chip 12 via line 22. The first and second chips 12, 12A are supported by a card 24 which is configured to be integrated into a computer or other electrical circuitry as one having ordinary skill in the art would understand.

Figure 2:
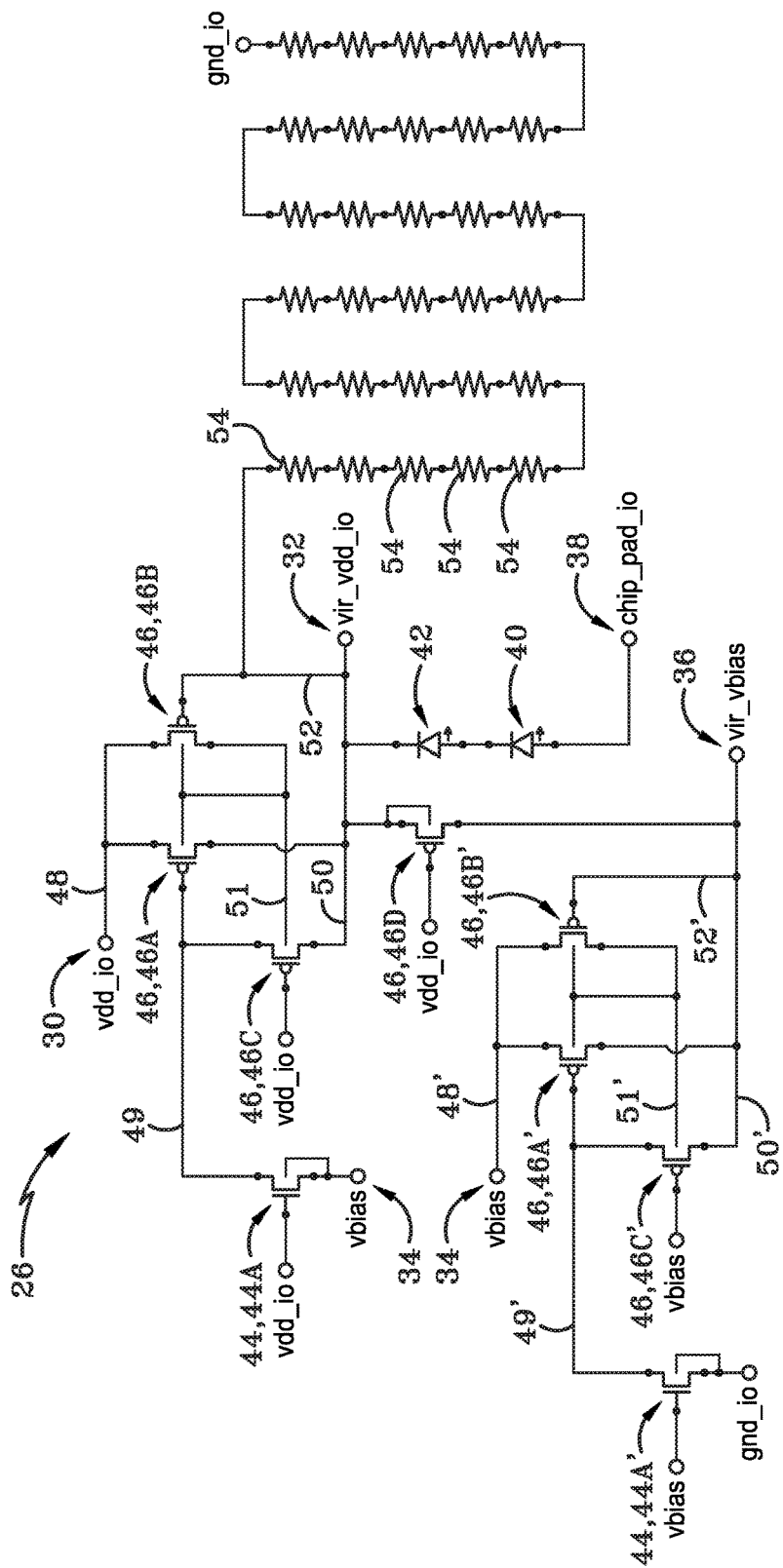
FIG. 2 (FIG. 2) is a schematic view of a bias circuit associated with the off chip driver in accordance with one embodiment of the present disclosure.
Figure 5:
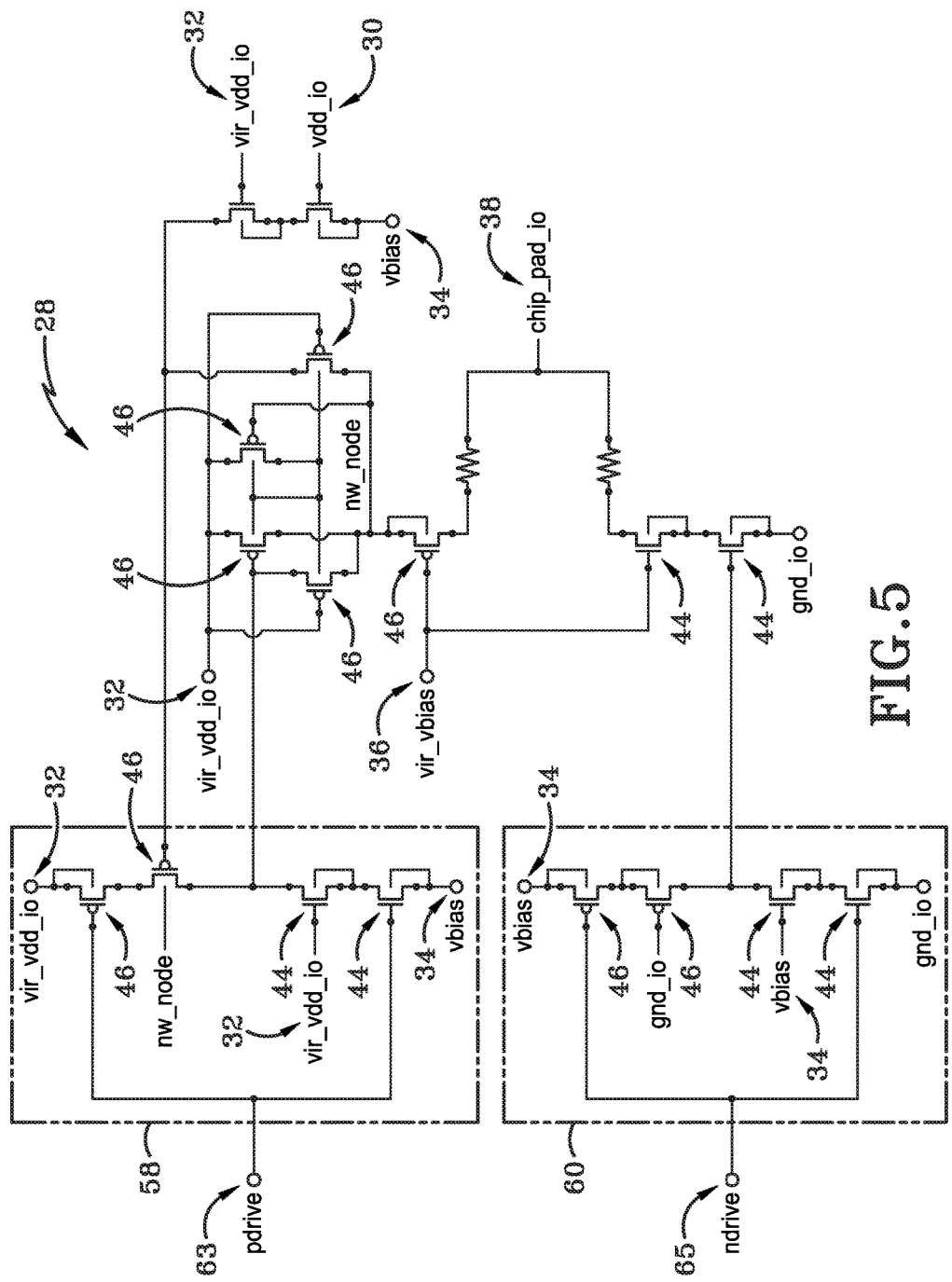
FIG. 5 (FIG. 5) is a schematic view of a driver sub-cell circuit of the off chip driver that is electrically connected with the bias circuit of FIG. 2.

The off chip driver 10 includes a bias circuit 26 (FIG. 2) and a driver sub-cell circuit 28 (FIG. 5). The bias circuit 26 is in operative electrical communication with the driver sub-cell circuit 28 wherein similarly labeled nodes establish electrical connections between the bias circuit 26 and the driver sub-cell circuit 28. For example, as will be described in greater detail below, a first output, which may be labeled vir_vdd_io, is a node that connects with the similarly labeled nodes vir_vdd_io present in FIG. 5. Other nodes that are similarly labeled between FIG. 2 and FIG. 5 represent electrical connections there between.

Bias circuit 26 enables the sub-cell circuit 28 to operate in both a functional mode and a cold spare mode. Accordingly, the bias circuit 26 effectuates the off chip driver 10 functioning in a functional mode and in a cold spare mode. The bias circuit 26 may include a first input 30, which is also referred to as vdd_io 30, a first output 32, which is also referred to as vir_vdd_io 32, a second input 34, which is also referred to as vbias 34, a second output 36, which is also referred to as vir_vbias 36, a chip pad input/output 38, which is also referred to as chip_pad_io 38, a first diode 40, and second diode 42. Bias circuit 26 may further include a plurality of transistors located intermediate the components mentioned above. N-channel transistors are shown generally at 44 and P-channel transistors are shown generally at 46. N-channel transistors 44 may also be referred to as nFET(s) 44 and the P channel transistors 46 as pFET(s) 46.

A first pFET 46A source is connected with first input 30 via line 48. A first pFET 46A drain is connected with first output 32 via line 50. The gate of first pFET 46A is connected to line 49 while the body is connected to line 51. A second pFET 46B source is connected with first input 30 via line 48. A second pFET 46B gate is connected with first output 32 via line 52. The drain and body of second pFET 46B are connected to line 51. A third pFET 46C gate is connected to first input 30. A third pFET 46C drain is connected with first output 32 via line 50. The source of third pFET 46C is connected to line 49 while the body is connected to line 51. A first nFET 44A gate is connected to first input 30. A first nFET 44A source and body are connected to second input 34. The drain of first nFET 44A is connected to line 49.

A second portion of the bias circuit 26 is structurally similar to a first portion of the circuit extending from first input 30 to first output 32. Accordingly, a second portion of the circuit 26 is defined between second input 34 and second output 36. Transistors 46A', 46B', 46C' and 44A' are arranged similar to those of transistors 46A, 46B, 46C and 44A. Similarly, lines 48', 49', 50', 51' and 52' are connected in a manner similar to the first portion described above. A fourth pFET 46D source and body are connected with first output 32 via line 50. A fourth pFET 46D drain is connected with second output 36 via line 50'. A fourth pFET 46D gate is connected to first input 30.

A first diode 40 anode is connected to chip_pad_io 38. A first diode 40 cathode is connected to a second diode 42 anode. A second diode 42 cathode is connected with first output 32 via line 50.

A first resistor 54 positive terminal is connected with first output 32 via line 52. A first resistor 54 negative terminal is connected to circuit ground. While the resistor is shown diagrammatically as a plurality of series aligned resistors, it is entirely possible that the effective resistance may be accomplished by one resistor.

Figure 3:
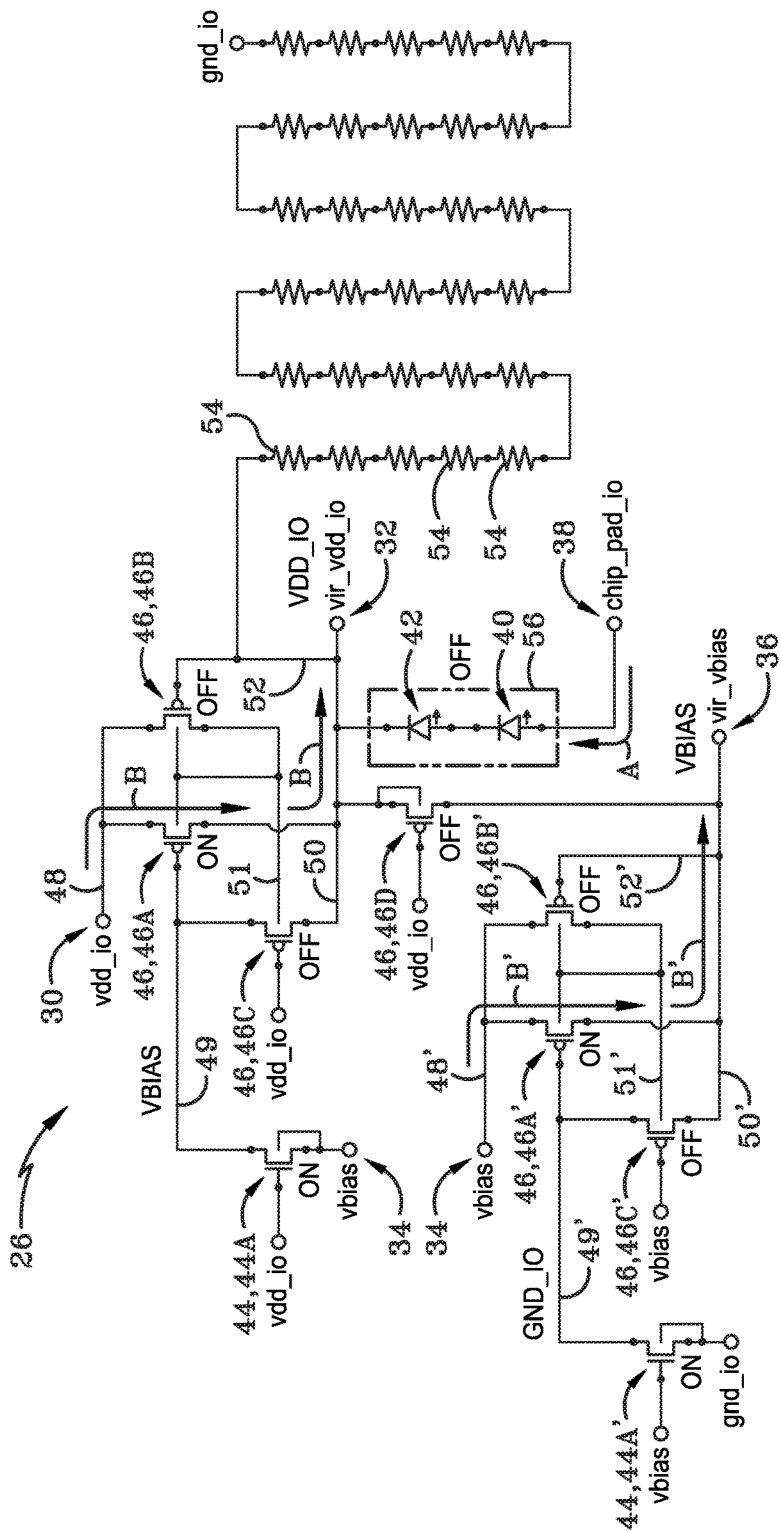
FIG. 3 (FIG. 3) is an operational schematic view of the bias circuit of FIG. 2 depicting two diodes in an off-state which is associated with a functional mode of the off chip driver.

FIG. 3 depicts the bias circuit 26 in the functional mode of the off chip driver 10. Functional mode is defined as operation when supply voltages are applied to first input 30 and second input 34. In functional mode, nFET 44A forces line 49 low which causes pFET 46A to drive the first output 32 to the same voltage level as the first input 30. Arrow B depicts the signal flow from the first input 30 to the first output 32. This in turn causes pFET 46B to turn off as its gate and source voltages are equal. Similarly, nFET 44A' forces line 49' low which causes pFET 46A' to drive the second output 36 to the same voltage level as the second input 34. Arrow B' depicts the signal flow from the second input 34 to the second output 36. This in turn causes pFET 46B' to turn off as its gate and source voltages are equal. Additionally, pFET 46C, pFET 46D and pFET 46C' are forced off due to their gate and source voltages being equal. Furthermore, the first diode 40 and second diode 42 will remain in their high impedance state unless the chip_pad_io 38 voltage exceeds vdd_io 30 by more than two diode threshold voltages which will not occur in a typical system application. The net result is that the bias circuit 26 simply passes vdd_io 30 to vir_vdd_io 32 and vbias 34 to vir_vbias 36 in the functional mode.

Figure 4:
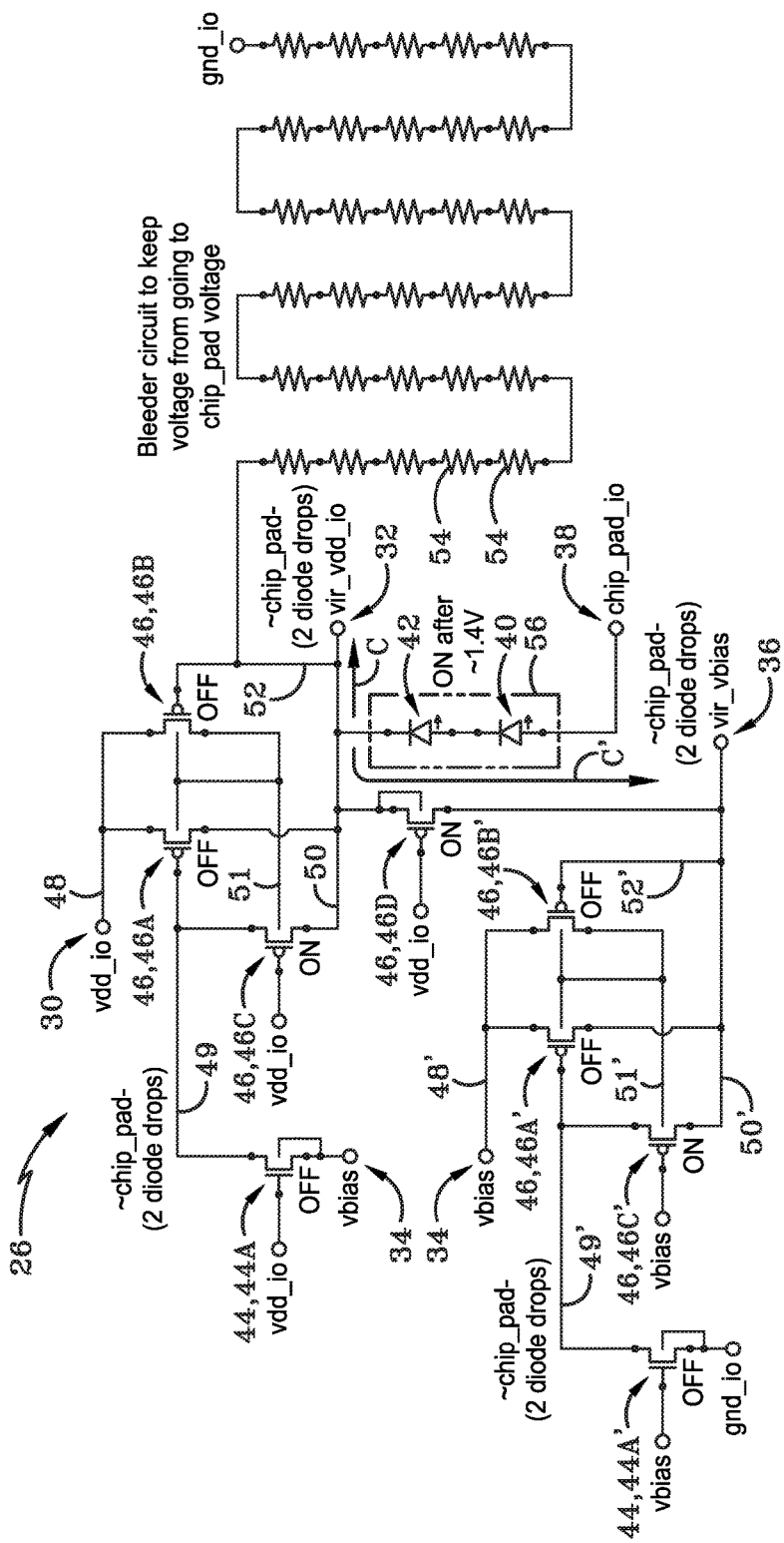
FIG. 4 (FIG. 4) is an operational schematic view of the bias circuit depicted in FIG. 2 with the two diodes in an on-state which is associated with a cold spare mode of the off chip driver.

FIG. 4 depicts the bias circuit 26 in the cold spare mode of the off chip driver 10. Cold spare mode is defined as operation when the supply voltages are grounded for first input 30 and second input 34. When a voltage exceeding two diode threshold voltages is applied to chip_pad_io 38 it causes the first diode 40 and the second diode 42 to conduct forcing the first output 32 to a voltage equal to the voltage applied to chip_pad_io 38 minus two diode threshold voltages. Arrow C depicts the signal flow from chip_pad_io 38 to the first output 32. As a result of the voltage on the first output 32, pFET 46B is forced into the off state due to the gate voltage being greater than the source voltage. Furthermore, the voltage on the first output 32 causes pFET 46C to drive line 49 to the same voltage level as the first output 32 since the gate voltage is less than the source voltage. The voltage applied to line 49 forces pFET 46A into the off state due to the gate voltage being greater than the source voltage. Finally, nFET 44A is forced into the off state due to the gate and source voltage being equal. The first resistor 54 creates a low current path to ground which prevents the first output 32 voltage from exceeding the voltage applied to chip_pad_io 38 minus two diode threshold voltages.

With continued reference to FIG. 4, and in accordance with one aspect of the present disclosure, the voltage on the first output 32 causes pFET 46D to drive the second output 36 to the same voltage as the first output 32 since the gate voltage is less than the source voltage. Arrow C' depicts the signal flow from chip_pad_io 38 to the second output 36. As a result of the voltage on the second output 36, pFET 46B' is forced into the off state due to the gate voltage being greater than the source voltage. Furthermore, the voltage on the second output 36 causes pFET 46C' to drive line 49' to the same voltage level as the second output 36 since the gate voltage is less than the source voltage. The voltage applied to line 49' forces pFET 46A' into the off state due to the gate voltage being greater than the source voltage. Finally, nFET 44A' is forced into the off state due to the gate and source voltage being equal. The net result is that the bias circuit 26 siphons voltage from the chip_pad_io 38 signal and sends it to vir_vdd_io 32 and vir_vbias 36 in the cold spare mode. This siphoned voltage acts as a protection voltage to allow the off chip driver 10 to operate with an extended voltage range in both the functional mode and the cold spare mode. The present disclosure offers a unique capability in that extended voltage range operation has never been demonstrated in the cold spare mode.

FIG. 5 depicts the driver sub-cell circuit 28 which includes first inverter circuitry, which may also be referred to as a first inverter 58, and second inverter circuitry, which may also be referred to as a second inverter 60. First inverter 58 includes an input 63, which may also be referred to as P-drive 63. Second inverter 60 includes an input 65, which may also be referred to as N-drive 65. When the driver sub-cell 28 is in the functional mode, signals flow through respective inputs 63, 65 of the first and second inverters 58, 60 and flow towards chip pad 38. Inasmuch as the diodes 40, 42 on bias circuit 26 are off when the driver sub-cell circuit 28 is in the functional mode, the signals moving through chip pad 38 do not pass as the signal is precluded by the off-state diodes 40, 42. Signals flow into the first input 30 and then outwardly through bias circuit 26 to the first output 32. Additionally, signals move through second input 34 towards second output 36 through the bias circuit 26. When the driver sub-cell circuit 28 is in the functional mode, circuit 28 behaves as a traditional off chip driver and is able to operate at a first voltage. When the bias circuit 26 is turned from the functional mode to the cold spare mode, the circuitry of the bias circuit 26 enables the cold spare mode to still handle a voltage across chip pad 38 that is equal to the voltage moving through the circuit in transparent or functional mode. Stated otherwise, the bias circuit 26 and its components enable the off chip driver 10 to handle the same voltage at the chip pad 38 in both the functional mode and the cold spare mode. This is remarkably different from conventional off chip drivers which may have cold spare capabilities, but cannot support the extended range voltages in the functional mode and the cold spare mode. For example, conventional off chip drivers with cold spare capabilities can handle a first voltage in the functional mode and a lower second voltage in the cold spare mode. The off chip driver 10 of the present disclosure comprising the bias circuit 26 and the driver sub-cell circuit 28 is advantageous inasmuch as it allows same voltage (as much as 2X voltage a single transistor can reliably operate at) to be handled at the chip pad 38 in both the functional mode and the cold spare mode. The basic design of the driver sub-cell circuit 28 is similar to other cold spare off chip driver circuits but has been modified to support an extended voltage range through the use of device stacking techniques commonly known to those skilled in the art.

Figure 6:
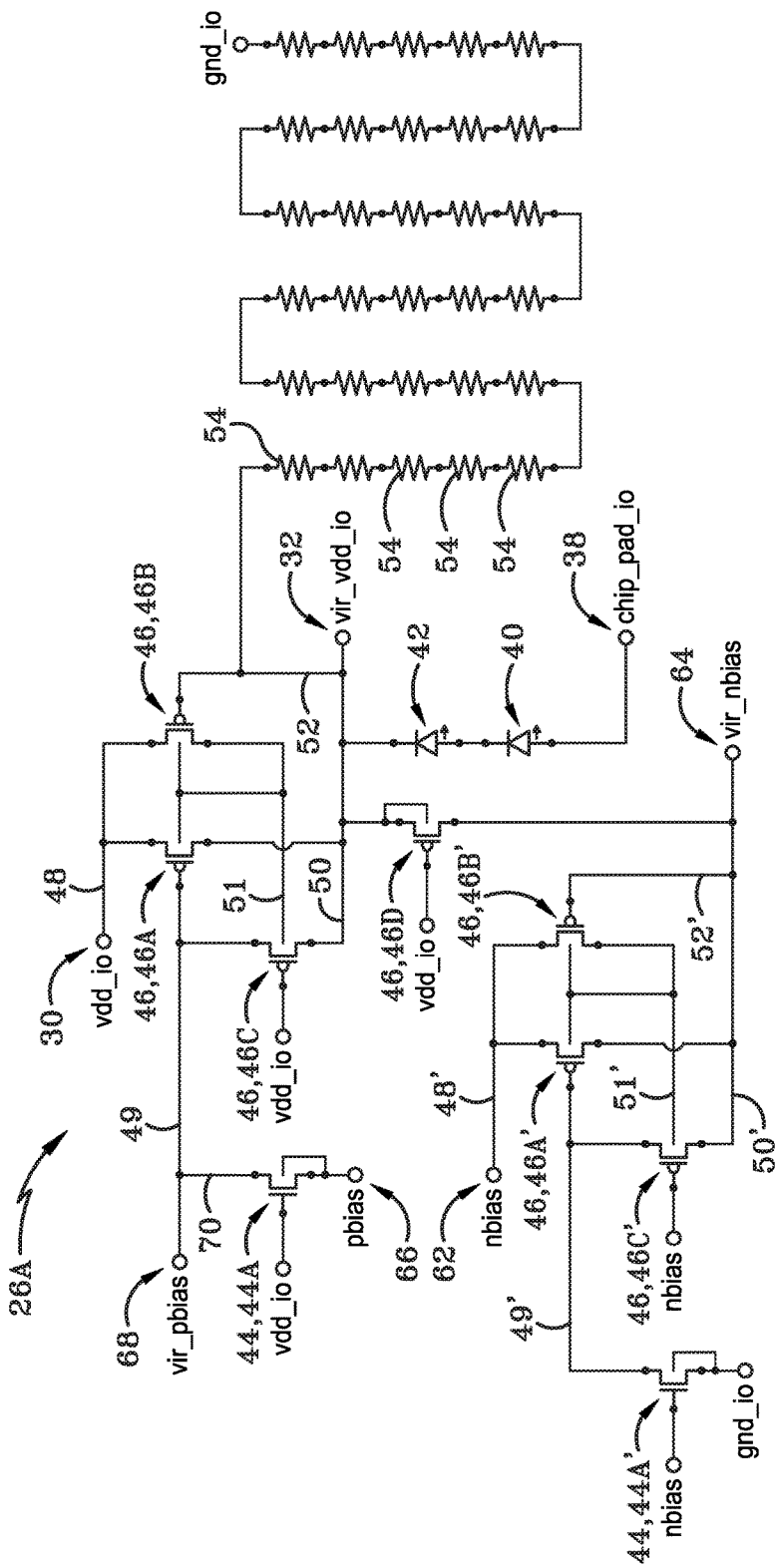
FIG. 6 (FIG. 6) is a schematic view of an alternative embodiment of the bias circuit having a P-bias input and an N-bias input.
Figure 9:
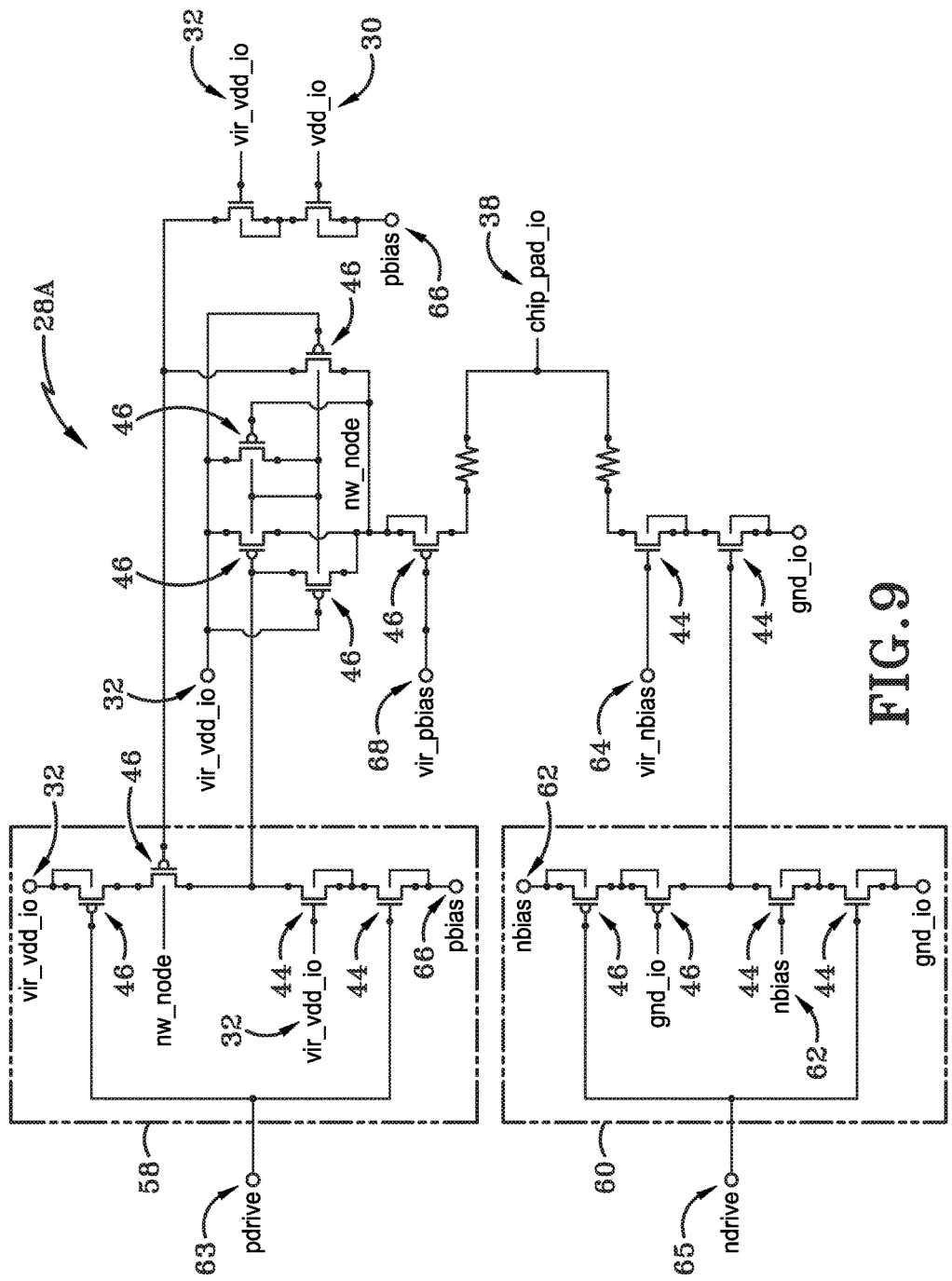
FIG. 9 (FIG. 9) is an alternative embodiment of a driver sub-cell circuit having the N-bias and P-bias inputs which connect with the bias circuit of FIG. 6.

An alternative exemplary embodiment of the off chip driver 10 includes a bias circuit 26A (FIG. 6) and a driver sub-cell circuit 28A (FIG. 9). The bias circuit 26A is in operative electrical communication with the driver sub-cell circuit 28A wherein similarly labeled nodes establish electrical connections between the bias circuit 26A and the driver sub-cell circuit 28A. For example, as will be described in greater detail below, a first output, which may be labeled vir_vdd_io, is a node that connects with the similarly labeled nodes vir_vdd_io present in FIG. 9. Other nodes that are similarly labeled between FIG. 6 and FIG. 9 represent electrical connections there between.

Bias circuit 26A enables the sub-cell circuit 28A to operate in both a functional mode and a cold spare mode. Accordingly, the bias circuit 26A effectuates the off chip driver 10 functioning in a functional mode and in a cold spare mode. The bias circuit 26A may include a first input 30, which is also referred to as vdd_io 30, a first output 32, which is also referred to as vir_vdd_io 32, a second input 62, which is also referred to as nbias 62, a second output 64, which is also referred to as vir_nbias 64, a third input 66, which is also referred to as pbias 66, a third output 68, which is also referred to as vir_pbias 68, a chip pad input/output 38, which is also referred to as chip_pad_io 38, a first diode 40, and second diode 42. Bias circuit 26A may further include a plurality of transistors located intermediate the components mentioned above. N-channel transistors are shown generally at 44 and P-channel transistors are shown generally at 46. N-channel transistors 44 may also be referred to as nFET(s) 44 and the P channel transistors 46 as pFET(s) 46.

A first pFET 46A source is connected with first input 30 via line 48. A first pFET 46A drain is connected with first output 32 via line 50. The gate of first pFET 46A is connected to third output 68 while the body is connected to line 51. A second pFET 46B source is connected with first input 30 via line 48. A second pFET 46B gate is connected with first output 32 via line 52. The drain and body of second pFET 46B are connected to line 51. A third pFET 46C gate is connected to first input 30. A third pFET 46C drain is connected with first output 32 via line 50. The source of third pFET 46C is connected to third output 68 while the body is connected to line 51. A first nFET 44A gate is connected to first input 30. A first nFET 44A source and body are connected to third input 66. The drain of first nFET 44A is connected to third output 68.

A second portion of the bias circuit 26A is structurally similar to a first portion of the circuit extending from first input 30 to first output 32. Accordingly, a second portion of the circuit 26A is defined between second input 62 and second output 64. Transistors 46A', 46B', 46C' and 44A' are arranged similar to those of transistors 46A, 46B, 46C and 44A. Similarly, lines 48', 49', 50', 51' and 52' are connected in a manner similar to the first portion described above. A fourth pFET 46D source and body are connected with first output 32 via line 50. A fourth pFET 46D drain is connected with second output 64 via line 50'. A fourth pFET 46D gate is connected to first input 30.

A first diode 40 anode is connected to chip_pad_io 38. A first diode 40 cathode is connected to a second diode 42 anode. A second diode 42 cathode is connected with first output 32 via line 50.

A first resistor 54 positive terminal is connected with first output 32 via line 52. A first resistor 54 negative terminal is connected to circuit ground. While the resistor is shown diagrammatically as a plurality of series aligned resistors, it is entirely possible that the effective resistance may be accomplished by one resistor.

Figure 7:
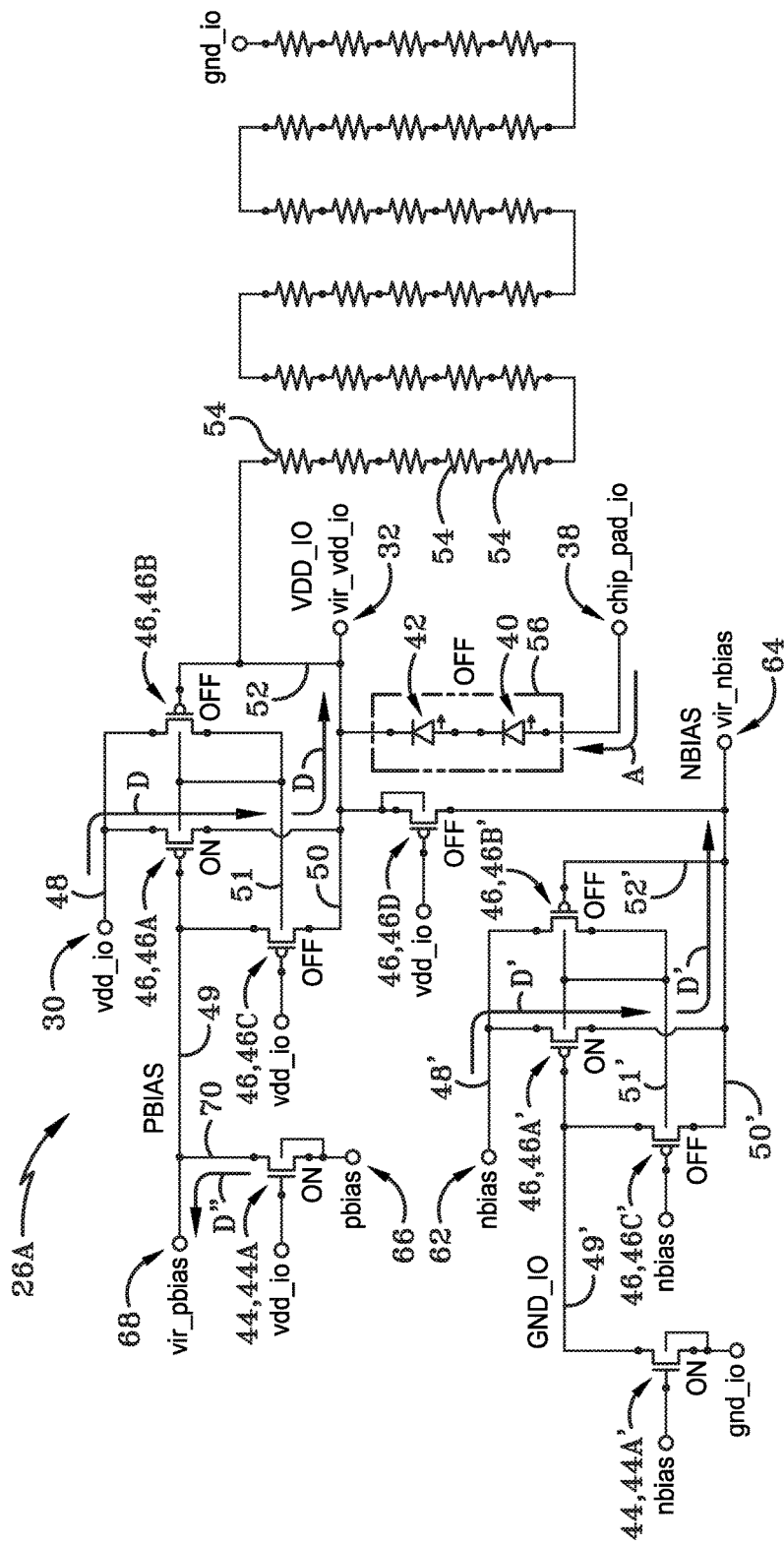
FIG. 7 (FIG. 7) is an operational schematic view of the bias circuit of FIG. 6 depicting two diodes in an off-state which is associated with a functional mode of the off chip driver.

FIG. 7 depicts the bias circuit 26A in the functional mode of the off chip driver 10. Functional mode is defined as operation when supply voltages are applied to first input 30 second input 62 and third input 66. In functional mode, nFET 44A forces the third output 68 to equal the third input 66 voltage which causes pFET 46A to drive the first output 32 to the same voltage level as the first input 30. Arrow D depicts the signal flow from the first input 30 to the first output 32. Arrow D" depicts the signal flow from the third input 66 to the third output 68. This in turn causes pFET 46B to turn off as its gate and source voltages are equal. Similarly, nFET 44A' forces line 49' low which causes pFET 46A' to drive the second output 64 to the same voltage level as the second input 62. Arrow D' depicts the signal flow from the second input 62 to the second output 64. This in turn causes pFET 46B' to turn off as its gate and source voltages are equal. Additionally, pFET 46C, pFET 46D and pFET 46C' are forced off due to their gate and source voltages being equal. Furthermore, the first diode 40 and second diode 42 will remain in their high impedance state unless the chip_pad_io 38 voltage exceeds vdd_io 30 by more than two diode threshold voltages which will not occur in a typical system application. The net result is that the bias circuit 26A simply passes vdd_io 30 to vir_vdd_io 32, nbias 62 to vir_nbias 64 and pbias 66 to vir_pbias 68 in the functional mode.

Figure 8:
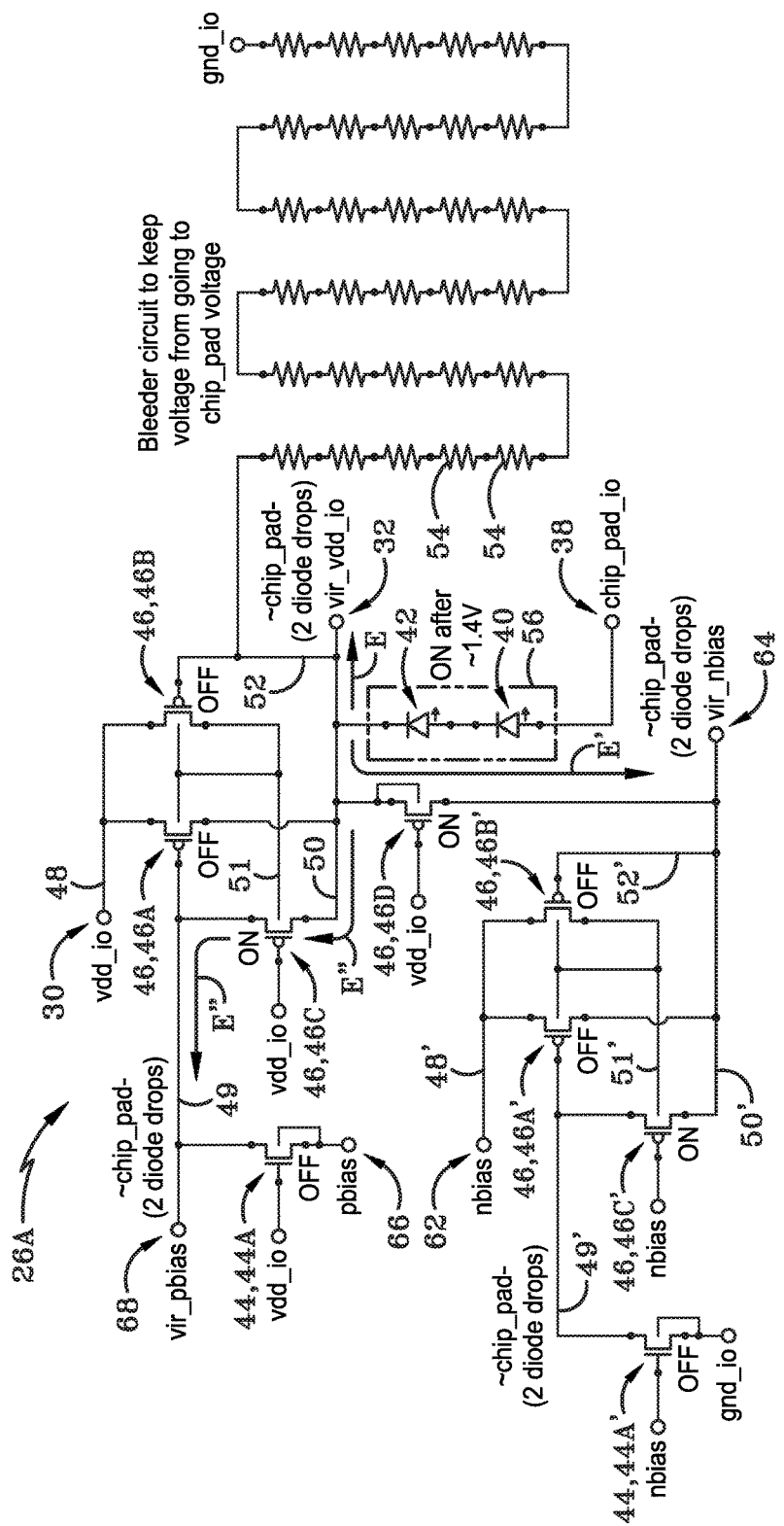
FIG. 8 (FIG. 8) is an operational schematic view of the bias circuit depicted in FIG. 6 with the two diodes in an on-state which is associated with a cold spare mode of the off chip driver.

FIG. 8 depicts the bias circuit 26A in the cold spare mode of the off chip driver 10. Cold spare mode is defined as operation when the supply voltages are grounded for first input 30 second input 62 and third input 66. When a voltage exceeding two diode threshold voltages is applied to chip_pad_io 38 it causes the first diode 40 and the second diode 42 to conduct forcing the first output 32 to a voltage equal to the voltage applied to chip_pad_io 38 minus two diode threshold voltages. Arrow E depicts the signal flow from chip_pad_io 38 to the first output 32. As a result of the voltage on the first output 32, pFET 46B is forced into the off state due to the gate voltage being greater than the source voltage. Furthermore, the voltage on the first output 32 causes pFET 46C to drive the third output 68 to the same voltage level as the first output 32 since the gate voltage is less than the source voltage. Arrow E" depicts the signal flow from chip_pad_io 38 to the third output 68. The voltage applied to the third output 68 forces pFET 46A into the off state due to the gate voltage being greater than the source voltage. Finally, nFET 44A is forced into the off state due to the gate and source voltage being equal. The first resistor 54 creates a low current path to ground which prevents the first output 32 voltage from exceeding the voltage applied to chip_pad_io 38 minus two diode threshold voltages.

With continued reference to FIG. 8, and in accordance with one aspect of the present disclosure, the voltage on the first output 32 causes pFET 46D to drive the second output 64 to the same voltage as the first output 32 since the gate voltage is less than the source voltage. Arrow E' depicts the signal flow from chip_pad_io 38 to the second output 64. As a result of the voltage on the second output 64, pFET 46B' is forced into the off state due to the gate voltage being greater than the source voltage. Furthermore, the voltage on the second output 64 causes pFET 46C' to drive line 49' to the same voltage level as the second output 64 since the gate voltage is less than the source voltage. The voltage applied to line 49' forces pFET 46A' into the off state due to the gate voltage being greater than the source voltage. Finally, nFET 44A' is forced into the off state due to the gate and source voltage being equal. The net result is that the bias circuit 26A siphons voltage from the chip_pad_io 38 signal and sends it to vir_vdd_io 32, vir_nbias 64 and vir_pbias 68 in the cold spare mode. This siphoned voltage acts as a protection voltage to allow the off chip driver 10 to operate with an extended voltage range in both the functional mode and the cold spare mode. The present disclosure offers a unique capability in that extended voltage range operation has never been demonstrated in the cold spare mode.

FIG. 9 depicts another exemplary embodiment of the driver sub-cell circuit 28A which includes first inverter circuitry, which may also be referred to as a first inverter 58, and second inverter circuitry, which may also be referred to as a second inverter 60. First inverter 58 includes an input 63, which may also be referred to as P-drive 63. Second inverter 60 includes an input 65, which may also be referred to as N-drive 65. When the driver sub-cell 28A is in the functional mode, signals flow through respective inputs 63, 65 of the first and second inverters 58, 60 and flow towards chip pad 38. Inasmuch as the diodes 40, 42 on bias circuit 26A are off when the driver sub-cell circuit 28A is in the functional mode, the signals moving through chip pad 38 do not pass as the signal is precluded by the off-state diodes 40, 42. Signals flow into the first input 30 and then outwardly through bias circuit 26A to the first output 32. Additionally, signals move through second input 62 towards second output 64 through the bias circuit 26A. Furthermore, signals move through third input 66 towards second output 68 through the bias circuit 26A. When the driver sub-cell circuit 28A is in the functional mode, circuit 28A behaves as a traditional off chip driver and is able to operate at a first voltage. When the bias circuit 26A is turned from the functional mode to the cold spare mode, the circuitry of the bias circuit 26A enables the cold spare mode to still handle a voltage across chip pad 38 that is equal to the voltage moving through the circuit in transparent or functional mode. Stated otherwise, the bias circuit 26A and its components enable the off chip driver 10 to handle the same voltage at the chip pad 38 in both the functional mode and the cold spare mode. This is remarkably different from conventional off chip drivers which may have cold spare capabilities, but cannot support the extended range voltages in the functional mode and the cold spare mode. For example, conventional off chip drivers with cold spare capabilities can handle a first voltage in the functional mode and a lower second voltage in the cold spare mode. The off chip driver 10 of the present disclosure comprising the bias circuit 26A and the driver sub-cell circuit 28A is advantageous inasmuch as it allows same voltage (as much as 2X the voltage a single transistor can reliably operate at) to be handled at the chip pad 38 in both the functional mode and the cold spare mode. The basic design of the driver sub-cell circuit 28A is similar to other cold spare off chip driver circuits but has been modified to support an extended voltage range through the use of device stacking techniques commonly known to those skilled in the art.

In accordance with an aspect of the present disclosure, the bias circuits 26, 26A described herein enable an off chip driver 10 to prevent excessive current moving through the circuit when the off chip driver is powered down (i.e., cold spare mode) but is still receiving signals moving through other parts of the system that are in electrical communication with the cold spare mode driver 10. The diodes 40, 42 are used to generate protection voltages from the input signal which prevent voltage over stress conditions from occurring due to operation at an extended voltage range. Preserving the integrity of the circuitry is critical in spacecraft applications because of the difficulty associated with changing/replacing a damaged circuit on a spacecraft computer card. Thus, it is envisioned that one specific application of off chip driver 10 of the present disclosure is incorporated into an electrical network aboard a spacecraft deployed outside earth's atmosphere.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Figure 10:
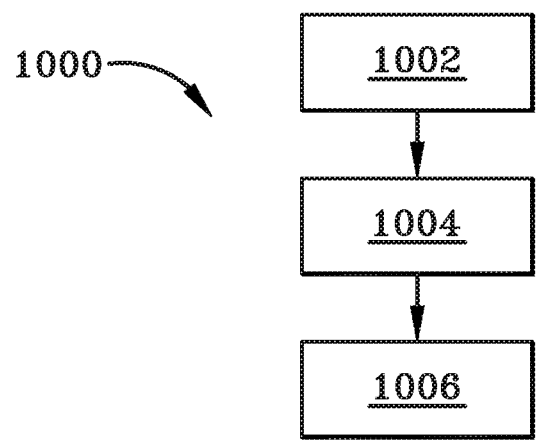
FIG. 10 (FIG. 10) is a flow chart representing an exemplary method in accordance with the present disclosure.

FIG. 10 is a flow chart depicting one embodiment of a method in accordance with the present disclosure generally at 1000. Method 1000 may include providing an off chip driver circuit that switches between a functional mode and a cold spare mode, wherein the off chip driver circuit supports a similar voltage in both the functional mode and the cold spare mode, shown generally at 1002. An off chip driver bias circuit that passes various supply and voltage protection signals in the functional mode but passes voltages derived from the chip pad in the cold spare mode, shown generally in 1004. An off chip driver sub-circuit receives the voltage signals from the off chip driver bias circuit, shown generally in 1006.

Method 1000 may further include inputting a first voltage at a first input (vdd_io) and sending the first voltage towards a first output (vir_vdd_io); subtracting a second voltage passing through at least two diodes from the first voltage from the first voltage to establish a third voltage; and outputting the third voltage through the first output; wherein subtracting the second voltage from the first voltage is adapted to enable transistors to be stacked to support the similar voltage in the cold spare mode. Method 1000 may further include creating bias voltages by sending voltage through two series diodes 40, 42, and applying the bias voltages to other transistors in the circuit, which is adapted to maintain the other transistors below an operating voltage maximum for each of the other transistors. Method 1000 may further include in functional mode, generating the bias voltages directly from the first input (vdd_io) and in cold spare mode, generating the bias voltages through two series diodes coupled with a chip pad input/output (I/O). Method 1000 may further include switching the two series diodes 40, 42 from and off-state to an on-state when voltage across the two series diodes exceeds a threshold voltage; and wherein switching the two series diodes from the off-state to the on-state switches the circuit from the functional mode to the cold spare mode. Method 1000 may further include bleeding voltage into the first output (vir_vdd_io) across the two series diodes 40, 42 from a chip pad input/output (I/O) in cold spare mode; and precluding voltage from bleeding voltage into the first output (I/O) so as to be functionally transparent in the functional mode. Method 1000 may additionally include passing voltage from the first input to the first output without any effect from the two series diodes in functional mode; and passing voltage from a second input (vbias) to a second output (vir_vbias) without any effect from the two series diodes in functional mode.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented with software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions for driving signals from driver 10 via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

The term "cold spare" or "cold spare" refers to one or more computing component(s), equipment or device that requires manual configuration and adjustment in the event of issues or total failure. It requires the suspension of normal computer/system operations until the component is repaired and/or replaced.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results.

The indefinite articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

An embodiment is an implementation or example of the present disclosure. Reference in the specification to "an embodiment," "one embodiment," "some embodiments," "one particular embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," or "other embodiments," or the like, are not necessarily all referring to the same embodiments.

If this specification-states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of the preferred embodiment of the disclosure are an example and the disclosure is not limited to the exact details shown or described.

What is claimed:

1. A circuit comprising:
   a functional mode operating at a first voltage; and
   a cold spare mode operating at the first voltage;
   wherein the circuit supports and operates at the first voltage in both the functional mode and the cold spare mode.

2. The circuit of claim 1, further comprising:
   a bias circuit; and
   an off chip driver sub-cell circuit, wherein the bias circuit is operatively coupled to the off chip driver sub-cell circuit and the bias circuit generates signals for cold spare voltage protection in the off chip driver.

3. The circuit of claim 2, wherein the bias circuit further comprises:
   a chip pad input/output (I/O) having a signal to be protected pass therethrough;
   a first diode in electrical communication with the chip pad I/O;
   a second diode in series with the first diode;
   wherein the first and second diodes define a feedback voltage with the chip pad i/o to cause the circuit to be transparent in functional mode and operational in cold spare mode.

4. The circuit of claim 3, wherein the bias circuit further comprises:
   a first output (vir_vdd_io);
   a second output (vir_vbias);
   wherein the first output (vir_vdd_io) and second output (vir_vbias) are operatively connected to the off chip driver sub-cell circuit;
   wherein when the bias circuit is in the functional mode, the first output (vir_vdd_io) equals a driver circuit power supply voltage (vdd_io) such that the first and second diodes are electrically transparent such that signals flow directly and uninterrupted from the driver circuit power supply voltage (vdd_io) to first output (vir_vdd_io).

5. The circuit of claim 4, wherein the bias circuit further comprises:
   a first p-channel field effect transistor (pFET) electrically coupled between the first output (vir_vdd_io) and the driver circuit power supply voltage (vdd_io) configured to be turned off in cold spare mode to pass voltage directly from the driver circuit power supply voltage (vdd_io) to the first output (vir_vdd_io).

6. The circuit of claim 5, wherein the first and second diodes siphons input voltage from the chip pad i/o in the cold spare mode.

7. The circuit of claim 6, wherein subtracting the second voltage from the first voltage is adapted to enable transistors to be stacked to support the similar voltage in the cold spare mode.

8. The circuit of claim 7, wherein the bias circuit further comprises:
   a bias voltage generated from the driver circuit power supply voltage (vdd_io) in functional mode and generated from the two series diodes in the ESD in cold spare mode, wherein the bias voltage is adapted to maintain other transistors below an operating voltage maximum for each of the other transistors while the total circuit operates at higher than the voltage maximum for each respective transistor.

9. The circuit of claim 8, wherein the bias circuit further comprises:
   an off-state and an on-state of the first and second diodes;
   a threshold voltage of the first and second diodes, wherein when voltage from the chip pad I/O exceeds the threshold voltage, the first and second diodes are switched from the off-state to the on-state, and switching the first and second diodes from the off-state to the on-state switches the circuit from the functional mode to the cold spare mode.

10. The circuit of claim 9, wherein the bias circuit further comprises:

wherein when the bias circuit is in cold spare mode, the voltage at the first output (vir_vdd_io) is two diode drops less than the voltage at the first output (vir_vdd_io) in functional mode, and the voltage at the second output (vir_vbias) is two diode drops less than the voltage at the second output (vir_vbias) in functional mode.

11. The circuit of claim 10, wherein the bias circuit does not affect functionality of the off chip driver sub-cell circuit in functional mode.

12. The circuit of claim 11, wherein the bias circuit further comprises:
   at least one resistor located intermediate the first input (vdd_io) and the first output (vir-vdd_io) to bleed voltage prior to the first output in the cold spare mode adapted to assist phantom powering of the first output (vir_vdd_io) in cold spare mode to prevent a build up of voltage over time.

13. The circuit of claim 12, wherein the bias circuit further comprises:
   a functional mode first voltage and the first input (vdd_io);
   a functional mode second voltage at a second input (vbias); wherein the functional mode first and second voltages at the respective first and second inputs are different.

14. The circuit of claim 13, wherein the off chip driver sub-cell circuit further comprises:
   a first inverter having a first inverter input;
   a second inverter having a second inverter input;
   wherein the first and second inverters include stacked transistors adapted to operate at an extended voltage range; and
   wherein the first and second inverter inputs receive one signal therethrough at different voltage levels, and the signal is sent through the first and second inverters to the chip pad I/O.

15. A method comprising:
   providing an off chip driver circuit that switches between a functional mode and a cold spare mode, wherein the off chip driver circuit supports similar voltage in both the functional mode and the cold spare mode;
   passing supply and voltage protection signals through a bias circuit in the off chip drive circuit in the functional mode but passing voltages derived from a chip pad in the cold spare mode; and
   receiving the voltage signals, in an off chip driver sub-circuit, from the off bias circuit.

16. The method of claim 15, further comprising:
   inputting a first voltage at a first input (vdd_io) and sending the first voltage towards a first output (vir_vdd_io);
   subtracting a second voltage passing through at least two diodes from the first voltage from the first voltage to establish a third voltage; and
   outputting the third voltage through the first output;
   wherein subtracting the second voltage from the first voltage is adapted to enable transistors to be stacked to support the similar voltage in the cold spare mode.

17. The method of claim 15, further comprising:
   creating bias voltages by sending voltage through two series diodes;
   applying the bias voltages to other transistors in the circuit, which is adapted to maintain the other transistors below an operating voltage maximum for each of the other transistors.

18. The method of claim 16, further comprising:
   in functional mode, generating the bias voltages directly from the first input (vdd_io); and
   in cold spare mode, generating the bias voltages through two series diodes coupled with a chip pad input/output (I/O).

19. The method of claim 15, further comprising:
   switching the two series diodes from and off-state to an on-state when voltage across the two series diodes exceeds a threshold voltage; and
   wherein switching the two series diodes from the off-state to the on-state switches the circuit from the functional mode to the cold spare mode;
   bleeding voltage into the first output (vir_vdd_io) across the two series diodes from a chip pad input/output (I/O) in cold spare mode;
   precluding voltage from bleeding voltage into the first output (I/O) so as to be functionally transparent in the functional mode.

20. The method of claim 15, further comprising:
   passing voltage from the first input to the first output without any effect from the two series diodes in functional mode; and
   passing voltage from a second input (vbias) to a second output (vir_vbias) without any effect from the two series diodes in functional mode.

\* \* \* \* \*